(12) United States Patent  
Posner

(10) Patent No.: US 6,556,076 B1  
(45) Date of Patent: Apr. 29, 2003

(54) FEED FORWARD AMPLIFIER WITH AMPLIFIER STAGE FAILURE DETECTION USING PILOT TONES

(75) Inventor: Richard Posner, Tarzana, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/023,340

(22) Filed: Dec. 17, 2001

(51) Int. Cl.⁷ .............................. H03F 3/66; H03F 1/14; H03F 1/52
(52) U.S. Cl. .................. 330/52; 330/51; 330/207 P; 330/151
(58) Field of Search .................. 330/52, 149, 151, 330/51, 207 P

(56) References Cited

U.S. PATENT DOCUMENTS

| | | | |
|---|---|---|---|
| 4,580,105 A | 4/1986 | Myer | 330/149 |
| 5,130,663 A | 7/1992 | Tattersall, Jr. | 330/52 |
| 5,313,657 A * | 5/1994 | Sakamoto et al. | 330/52 X |
| 5,323,119 A | 6/1994 | Powell et al. | 330/151 |
| 5,444,418 A | 8/1995 | Mitzlaff | 330/52 |
| 5,576,659 A | 11/1996 | Kenington et al. | 330/52 |
| 5,644,268 A | 7/1997 | Hang | 330/151 |
| 5,691,668 A | 11/1997 | Yoshikawa et al. | 330/151 |
| 5,770,971 A | 6/1998 | McNicol | 330/52 |
| 5,774,018 A | 6/1998 | Gianfortune et al. | 330/52 |
| 5,789,976 A | 8/1998 | Ghannouchi et al. | 330/52 |
| 5,796,304 A | 8/1998 | Gentzler | 330/52 |
| 5,874,856 A | 2/1999 | Van Horn | 330/151 |
| 5,926,067 A | 7/1999 | Myer et al. | 330/52 |
| 5,999,048 A | 12/1999 | Zhou | 330/151 |

* cited by examiner

*Primary Examiner*—Steven J. Mottola
(74) *Attorney, Agent, or Firm*—Myers, Dawes & Andras LLP

(57) ABSTRACT

An RF power amplifier with amplifier stage failure detection comprises an amplifier input for receiving an RF signal to be amplified, an amplifier output for outputting an amplified RF signal, a plurality of separate amplifier stages coupled between the amplifier input and amplifier output so as to cumulatively provide a desired amplifier gain to the input RF signal, and means for detecting amplifier stage failure by providing a pilot tone to the amplifier stages, duty cycling the amplifier stages based on a separate timing for each stage and detecting the pilot tone output from the stages based on the timing.

20 Claims, 4 Drawing Sheets

FEED FORWARD AMPLIFIER WITH AMPLIFIER STAGE FAILURE DETECTION USING PILOT TONES

BACKGROUND OF THE INVENTION

1. Field of the Invention

The present invention relates to RF power amplifiers and methods of RF signal amplification. More particularly, the present invention relates to RF feed forward amplifiers and related methods of signal amplification.

2. Description of the Prior Art and Related Information

FIG. 1 illustrates a conventional feed forward amplifier design having a main amplifier path 1 and an error amplifier path 2 with the error path designed to substantially eliminate distortion introduced into the main amplifier path through the operation of the main amplifier. As the amplifier ages and as other circumstances affect the operation of the amplifier, the effectiveness of the error cancellation will typically be degraded. To compensate and to provide a dynamic correction of such effects, a pilot tone has been employed which is injected into the main amplifier path. The pilot tone is typically chosen so that it is readily distinguished from the input signal to be amplified. Since the pilot signal is only injected into the main amplifier path and not the error path, it should in principle be treated in the same manner as distortion introduced by the amplifier and should therefore be eliminated by the operation of the error path. If the pilot tone is detected at the output of the feed forward amplifier, its presence indicates a lack of perfect cancellation of distortion introduced into the main amplifier path. This detected pilot tone can then be used to control parameters in the main or error path to attempt to eliminate the pilot tone and therefore improve the compensation of the error path for errors introduced into the main signal path.

In many high power applications of feed forward amplifiers the main amplifier (and possibly error amplifier) comprises a number of individual amplifier stages or legs which are coupled together in various architectures. Two such common architectures integrating a number of smaller amplifier stages 3 into a larger amplifier are illustrated in FIGS. 2A and 2B. The use of a number of smaller amplifiers has a number of advantages such as reduced cost and improved heat dissipation. However, one disadvantage occurs due to the possibility of a single one of the amplifiers failing. In such case, it may not be easily detectable that an amplifier stage has failed. In particular, the compensation controls built into the amplifier may treat the slight reduction in power in either the main or error amplifier as distortion or some type of parameter change which requires compensation. This can then cause the control system to overdrive the amplifier causing distortion in the overall output and/or premature failure of the system. Also, with the loss of a single stage in one of the amplifiers being undetected the nature of a fluctuation in the quality of the output signal magnitude may be mostly attributed to other factors and necessary maintenance not performed. Therefore, it is important to provide a simple and effective way of checking whether or not a single amplifier stage in an amplifier network in a feed forward amplifier arrangement has failed.

Prior approaches to detecting such single amplifier stage failure have suffered from various deficiencies. For example, one approach monitors the power output to each amplifier stage looking for a drop in output indicating a potential failure. This approach has a disadvantage in that amplifier output may drop due to variation of the input signal for one reason or another. This may trigger a false amplifier failure indication of the system. Also, there is inherent cross-coupling in the power of the various stages and this can also interfere with accurate detection of failure of an individual amplifier stage in this method. Other approaches are also known for detecting single stage failure but they also suffer from reliability problems and other disadvantages such as complexity and cost.

Therefore, a problem presently exists in feed forward amplifier designs due to the lack of an effective and efficient way of detecting amplifier stage failure where the stage is in a large parallel architecture.

SUMMARY OF THE INVENTION

The present invention provides an efficient and effective system and method for detecting individual amplifier stage failure using pilot tones.

In a first aspect the present invention provides an RF power amplifier comprising an amplifier input for receiving an RF signal to be amplified, an amplifier output for outputting an amplified RF signal, and a multi-stage amplifier comprising a plurality of separate amplifier stages coupled between the amplifier input and amplifier output so as to cumulatively provide a desired amplifier gain to the input RF signal. A pilot tone generation circuit injects a pilot tone into the multi-stage amplifier. An amplifier control circuit is coupled to the plurality of separate amplifier stages and cycles the amplifier stages ON and OFF. A failure detection circuit is coupled to detect the pilot tone output from the multi-stage amplifier and detects individual amplifier stage failure based on the detected pilot tones.

In a preferred embodiment, the amplifier control circuit controls the ON/OFF operation of the amplifier stages such that each stage is ON during a unique time slot for each amplifier stage. The failure detection circuit is coupled to the amplifier control circuit and receives the unique time slots therefrom and the failure detection circuit detects individual amplifier stage failure by comparing the detected pilot tone to the individual time slots corresponding to each amplifier stage. The amplifier control circuit may be separately coupled to the amplifier stage power supply inputs via a plurality of switches and controls the opening and closing of the plurality of switches based on the unique time slot for each amplifier stage.

In a further aspect the present invention provides an RF power amplifier with amplifier stage failure detection which comprises an amplifier input for receiving an RF signal to be amplified, an amplifier output for outputting an amplified RF signal, a plurality of separate amplifier stages coupled between the amplifier input and amplifier output so as to cumulatively provide a desired amplifier gain to the input RF signal, and means for detecting amplifier stage failure by providing a pilot tone to the amplifier stages, duty cycling the stages based on a separate timing for each stage and detecting the pilot tone output from the stages based on the timing. The means for detecting amplifier stage failure preferably comprises amplifier control means for duty cycling the amplifier stages based on a separate timing for each stage and failure detect means for detecting the pilot tone output from the stages and detecting stage failure when a pilot tone is missing at a timing corresponding to a stage ON cycle. The amplifier control means preferably comprises a plurality of switches coupling the amplifier power supply to the amplifier stages, and an amplifier control circuit coupled to the switches and providing an ON/OFF control signal to the switches based on the timing. The amplifier control circuit may be separately coupled to each of the switches.

In a further aspect the present invention provides a feed forward amplifier comprising an RF input for receiving an RF signal and a main amplifier signal path coupled to the input comprising a main amplifier having a plurality of separate amplifier stages. A pilot tone generator generating a pilot tone is coupled into the main amplifier input. A failure detection monitoring circuit is coupled to the main amplifier output. An amplifier control circuit controls the ON operation of the separate amplifier stages based on separate time slots. The main amplifier signal path of the feed forward amplifier further comprises a first delay circuit coupled to the output of the main amplifier. The feed forward amplifier further comprises an error amplifier signal path coupled to the RF input and receiving a gain reduced output from the main amplifier. The error amplifier signal path comprises a second delay circuit coupled to the RF input, a combiner coupling the delay circuit output to the gain reduced output from the main amplifier so as to be out of phase therewith, and an error amplifier for amplifying the output of the combiner. The feed forward amplifier further comprises a second combiner combining the output from the error amplifier and the first delay circuit so as to be out of phase therewith, and an output coupled to the second combiner and providing an amplified RF output. The amplifier control circuit preferably comprises a plurality of switches coupled between the amplifier power supply and respective amplifier stages and a control circuit coupled to the switches and controlling the opening and closing of the switches. In particular, the control circuit provides a sequence of control signals in a time ordered sequence to the plurality of switches. The amplifier control circuit also provides the time ordered sequence to the failure detection circuit and the failure detection circuit provides a failure detect signal when a pilot tone is missing in a time slot corresponding to an amplifier stage. The sequence of control signals may be ON/OFF control signals.

In a further aspect the present invention provides a method for detecting amplifier stage failure in an RF amplifier having a main amplifier with a plurality of amplifier stages. The method comprises providing a pilot tone to the main amplifier, duty cycling the amplifier stages with a unique time slot for each amplifier stage, detecting the pilot tone output from the main amplifier, and providing an amplifier stage failure signal if a pilot tone is missing in a time slot corresponding to an amplifier stage. In a preferred embodiment the act of duty cycling the amplifier stages comprises providing an ON/OFF control signal to a plurality of switches respectively connected to each amplifier stage, and opening and closing the switches with a timing such that each stage is ON in a unique time slot. The act of duty cycling the amplifier stages may be performed periodically during amplifier operation, during amplifier start up, and/or during an amplifier test.

Further aspects of the invention will be appreciated from the following detailed description of the invention.

DETAILED DESCRIPTION OF THE INVENTION

Figure 1:
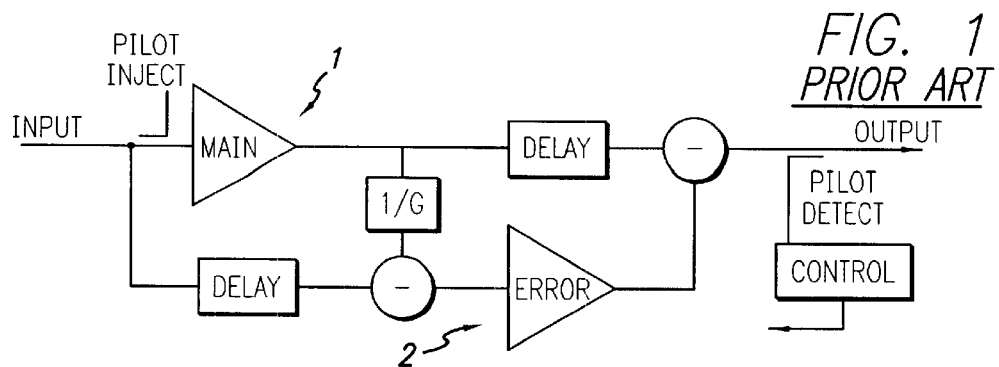
FIG. 1 is a block schematic drawing of a prior art feed forward amplifier.
Figure 2A:
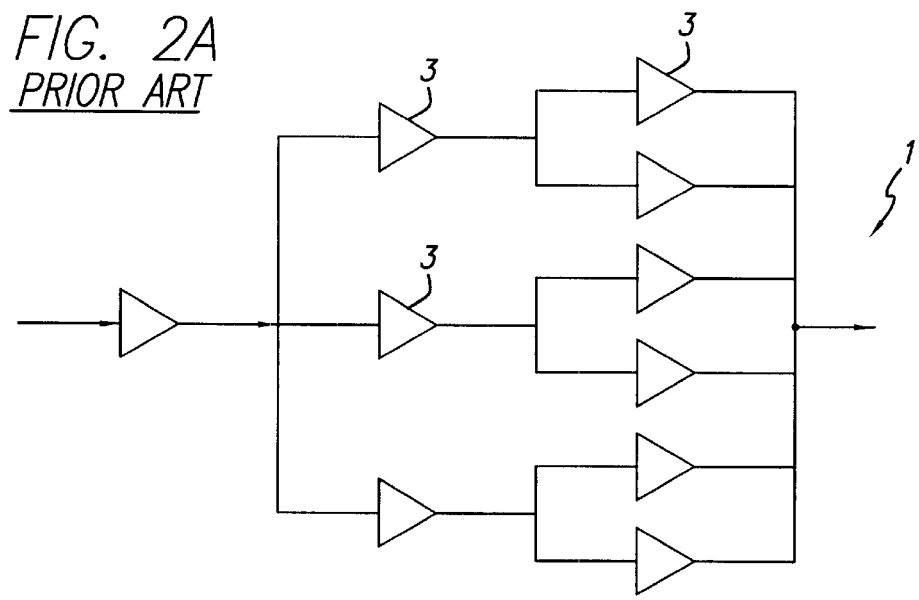
FIGS. 2A and 2B are block schematic drawings of prior art multi-stage amplifiers such as employed in feed forward amplifiers.
Figure 2B:
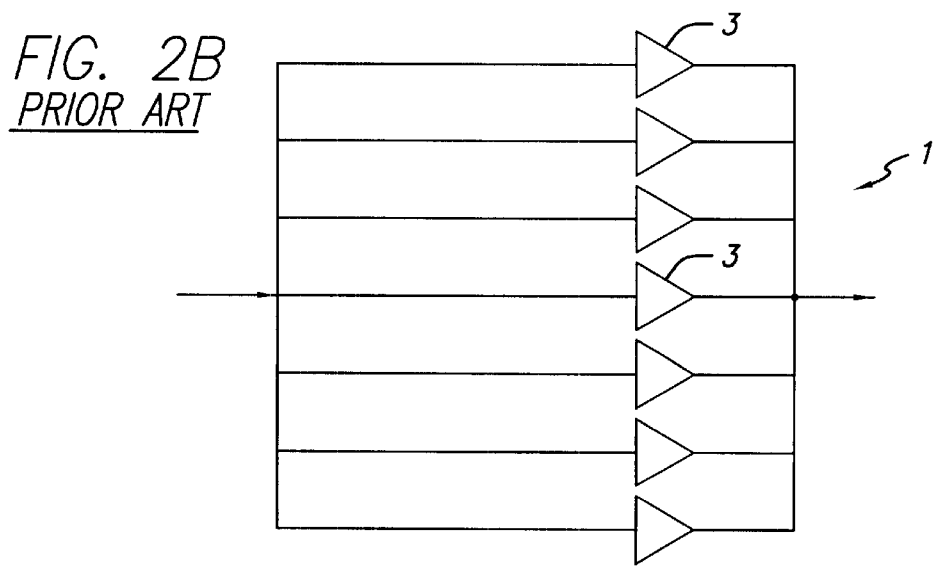
Figure 3A:
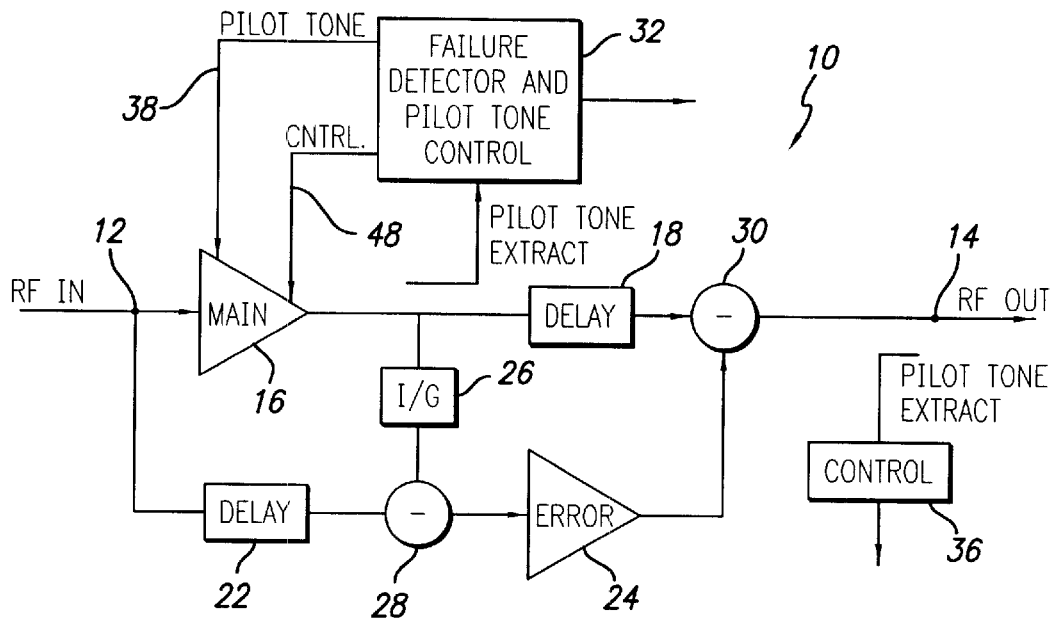
FIG. 3A is a block schematic drawing of a feed forward amplifier in accordance with the present invention and FIG. 3B illustrates the multi-stage main amplifier employed in the feed forward amplifier of FIG. 3A.
Figure 3B:
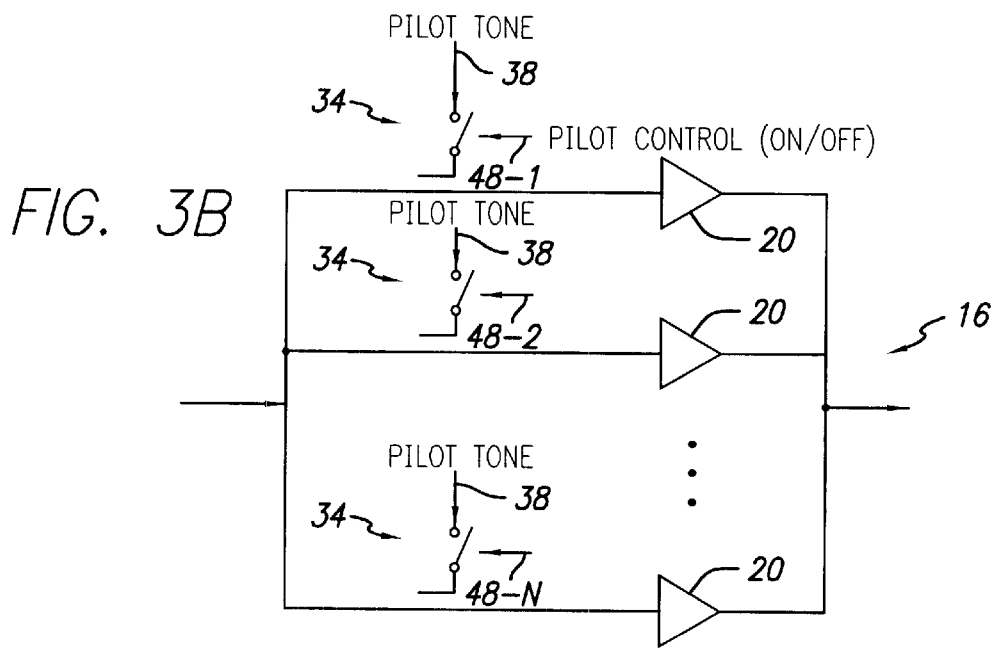

The first embodiment of the invention is illustrated in FIGS. 3A, 3B and 4–5. Referring first to FIG. 3A and 3B the overall feed forward amplifier 10 is illustrated. The feed forward amplifier 10 includes an input 12 which receives an input RF signal to be amplified and an output 14 which outputs the amplified RF signal. The input RF signal is split into a main amplifier signal path and an error amplifier signal path in accordance with well known feed forward amplifier design. The main amplifier signal path includes main amplifier 16 and delay 18, as illustrated. FIG. 3B illustrates the main amplifier 16 which has a plurality of individual amplifier stages 20. Various other amplifier stage configurations may also be provided, e.g. as shown in FIG. 2A. The error amplifier signal path in turn includes a delay 22 and an error amplifier 24, chosen to match the gain G of the main amplifier. In accordance with conventional feed forward amplifier operation, the output of the main amplifier 16 is attenuated at attenuator 26 and combined with the delayed input signal at 180 degrees (out of phase) combiner 28 to cancel all but the distortion component of the signal from the main signal path. This distortion component of the signal is provided to error amplifier 24 which restores the magnitude of the distortion component to that in the main signal path. Since the error amplifier 24 only amplifies the small distortion signal, a multi-stage configuration need not be employed to save cost and space. However, in some applications error amplifier 24 may have a multi-stage configuration matching that of main amplifier 16 shown in FIG. 3B. The amplified distortion component is then combined with the delayed main signal at 180 degrees (out of phase) combiner 30 to cancel the distortion component in the main signal path. A substantially distortion free amplified signal is then provided to the output 14.

Still referring to FIGS. 3A and 3B, the main amplifier signal path also includes a failure detector and pilot tone control circuit 32. In this embodiment, each stage of the main amplifier separately receives the pilot tone signal under the control of failure detector and pilot tone control circuit 32 which provides the pilot tone and a control signal to the main amplifier 16 along lines 38 and 48, respectively. For example, as illustrated in FIG. 3B, a plurality of switches 34 selectively couple respective amplifier stages to the pilot tone at an input thereof in response to a pilot ON/OFF control signal. The pilot ON/OFF signals may be cycled at a high frequency across the switches 34 with each amplifier stage 20 and corresponding switch 34 being associated with a particular time slot corresponding to a pilot ON signal for that stage. That is, the pilot signal instead of being applied simultaneously to all stages of the amplifier is individually cycled across each stage so that at any given time only a single stage receives the pilot tone signal. The pilot signal is extracted at the output of the main amplifier and provided to the failure detector and pilot tone control circuit 32 as illustrated in FIG. 3A. This circuit controls the cycling of the pilot ON/OFF signal and also compares the extracted pilot tone to the time slots corresponding to each stage of the amplifier. If a pilot signal is not detected for any given time slot, this indicates that the corresponding stage of the amplifier is not operational and a failure detect signal is output as shown in FIG. 3A. This failure detect signal may be used to generate a warning light on a control panel and/or to modify control of the parameters of the feed forward amplifier. The pilot tone may also be extracted at the amplifier output and provided to an amplifier control circuit 36. This control circuit may use the detected pilot tone to control the amplifier as is known in the feed forward amplifier art to reduce or eliminate the pilot tone at the output. This control can compensate for various factors, such as aging and temperature variations, which negatively affect the distortion cancellation of the amplifier. Therefore, in addition to providing a conventional amplifier control function the pilot tone can be used for amplifier stage failure detection.

Figure 4:
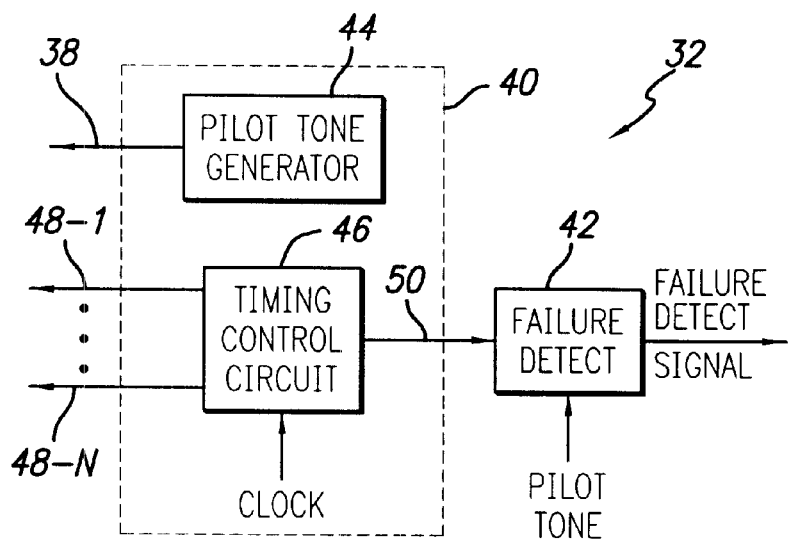
FIG. 4 is a block schematic drawing of the failure detector and pilot tone control circuit employed in the feed forward amplifier of FIG. 3A.
Figure 5:
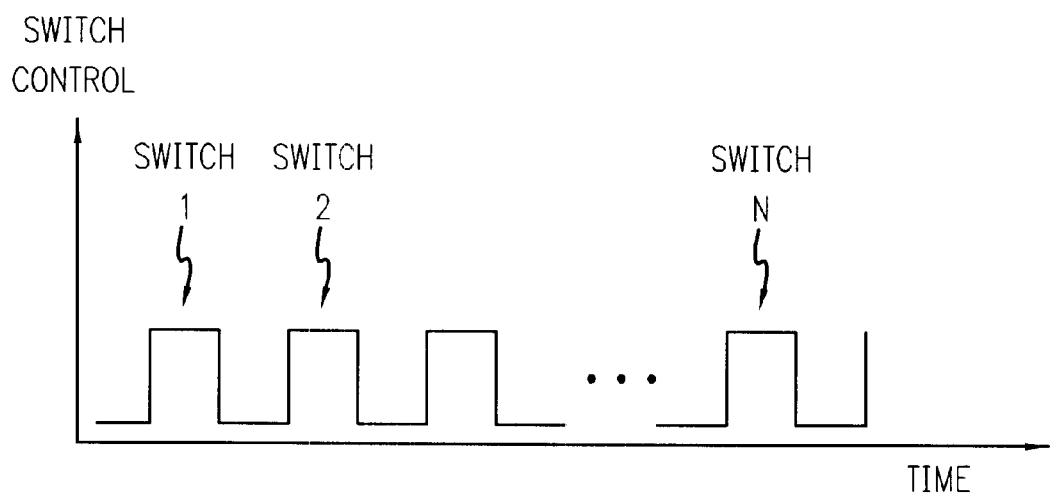
FIG. 5 is a timing diagram illustrating a control timing provided by the pilot tone control circuit employed in the feed forward amplifier of FIG. 3A.

Referring to FIG. 4, a block schematic drawing of the failure detector and pilot tone control circuit 32 employed in the feed forward amplifier of FIG. 3A is illustrated. As illustrated the failure detector and pilot tone control circuit includes a pilot tone control circuit 40 and a failure detect circuit 42. Pilot tone control circuit 40 includes a pilot tone generator 44 and a timing control circuit 46. Pilot tone generator 44 may be conventional in design and provides a suitable pilot tone to the plural amplifier stages as described above. Timing control circuit 46 in turn provides a suitable control signal to selectively couple the pilot tone to the amplifier stages. Timing control circuit 46 may thus receive a clock input and generate a control signal with a time slot for each amplifier stage. In the case of a switch 34 for each amplifier stage 20, as illustrated in FIG. 3B, timing control circuit 46 may provide a simple ON/OFF signal to each switch 34 along lines 48-1 to 48-N, respectively. The switch ON signal will be cycled to the different switches, as generally illustrated in the timing diagram of FIG. 5. The switch timing is also provided to the failure detect circuit 42 along line 50 which detects the pilot tone extracted from the main amplifier within each of the ON time slots for each amplifier stage. If the pilot tone is missing for any time slot an amplifier stage failure is indicated and a failure detect signal is output, as illustrated. The pilot tone ON time slots may be continuously cycled over the amplifier stages during amplifier operation or the pilot tone may be cycled over the amplifier stages at specified times such as at amplifier power up, in response to a test signal, or periodically during amplifier operation. Timing control circuit 46 and failure detect circuit 42 may comprise separate circuits, as illustrated, or their function may be implemented in a microprocessor.

In view of the above description, it will be appreciated that the present invention provides an effective way of detecting individual amplifier stage failure in a manner which does not suffer from the defects of prior approaches to this problem. Also, major modifications of the overall amplifier design are not needed.

It should be appreciated that a variety of modifications may be provided. For example, variations of this approach may use the pilot tone extracted from the output of the feed forward amplifier instead of having separate pilot tone extraction at the output of the main amplifier. This reduces somewhat the added circuitry, however, since the operation of the feed forward amplifier ideally cancels out the pilot signal there may be insufficient pilot tone at the output to detect individual stage failure in all instances. Therefore, generally the pilot extraction at the output of the main amplifier itself will be preferred in this case. Also, where a single pilot tone is preferably employed, i.e., the stage failure detection pilot tone is the same pilot tone used for the parameter control of the overall feed forward amplifier, a separate pilot tone may be used for the stage failure detection. This may be preferred in cases where the stage detection is only activated periodically whereas the primary pilot tone is desired to be continuously applied to the main amplifier. Also, while only the main amplifier is illustrated being monitored for individual amplifier stage failure, the system can obviously be employed for the error amplifier in exactly the same manner if a multi-stage error amplifier is employed.

Figure 6A:
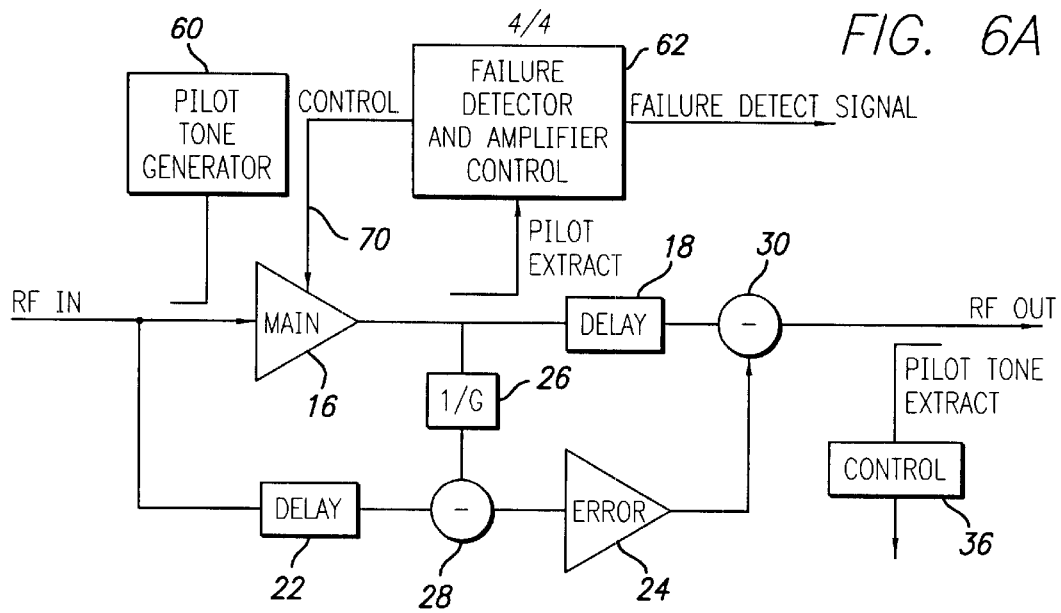
FIG. 6A is a block schematic drawing of a feed forward amplifier in accordance with an alternate embodiment of the present invention and FIG. 6B illustrates the multi-stage main amplifier employed in the feed forward amplifier of FIG. 6A.
Figure 6B:
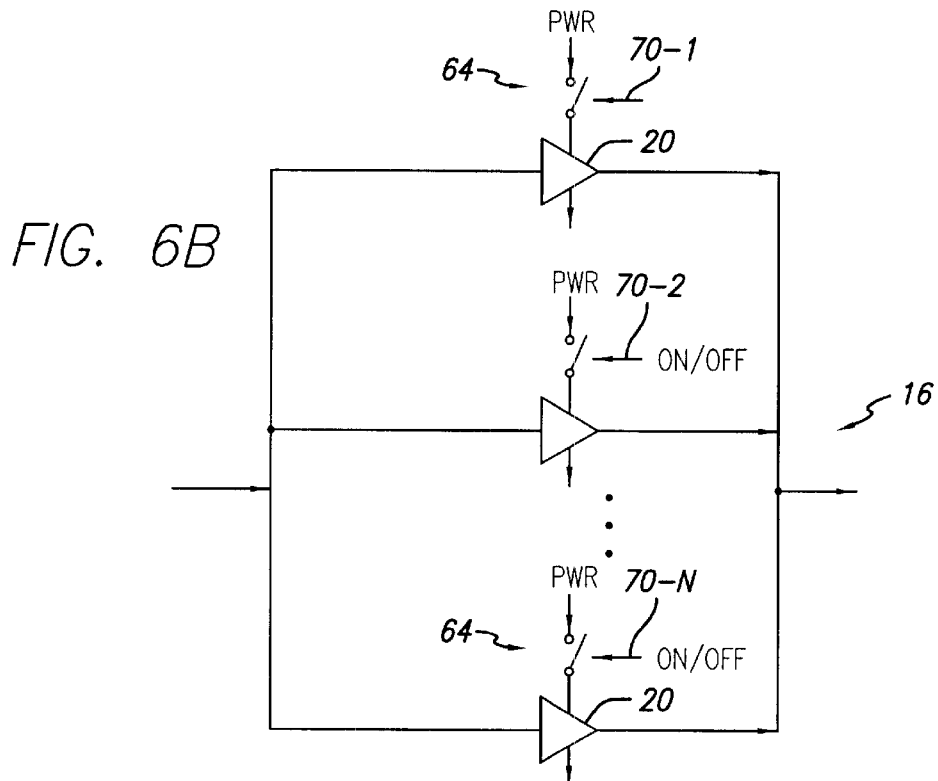
Figure 7:
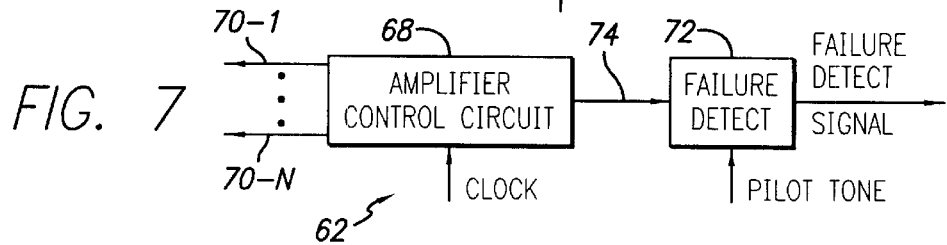
FIG. 7 is a block schematic drawing of the failure detector and amplifier control circuit employed in the feed forward amplifier of FIG. 6A.

An alternate embodiment of the invention is illustrated in FIGS. 6A, 6B and 7. FIG. 6A is a block schematic drawing of a feed forward amplifier in accordance with this alternate embodiment of the present invention and FIG. 6B illustrates the multistage main amplifier employed in the feed forward amplifier of FIG. 6A. FIG. 7 is a block schematic drawing of the failure detector and amplifier control circuit employed in the feed forward amplifier of FIG. 6A. In FIGS. 6A and 6B much of the feed forward amplifier structure and operation is the same as the previously described embodiment and a detailed discussion of like components will not be repeated.

In this embodiment, the pilot tone is applied as an input to the main amplifier 16, i.e., is applied to all stages of the main amplifier as in a conventional system, by pilot tone generator 60. The individual amplifier stages comprising the main amplifier 16 are, however, associated with unique time slots as in the previously described embodiment. More specifically, the individual amplifier stages 20 (shown in FIG. 6B) are cycled on and off under the control of an amplifier stage ON/OFF control signal separately provided along lines 70-1 to 70-N to switches 64 which selectively couple the respective amplifier stages to a power supply, as illustrated in FIG. 6B. As the ON/OFF control signals are cycled over switches 64 the respective amplifier stages are thus cycled on and off. The ON/OFF control signals are provided from a failure detector and amplifier control circuit 62 as shown in FIG. 6A. So as to not interfere with the operation of the system, the amplifier stages will all be in an ON state the majority of the time with periodic ON/OFF cycling of the stages to detect potential amplifier stage failure. For example, every 5 or 10 minutes, a 10–20 millisecond ON/OFF cycle could be processed through the stages of the amplifier. Alternatively, the power may be cycled to the amplifier stages at specified times such as at amplifier power up or in response to a test signal. As in the case of the first embodiment, each amplifier stage is associated with a time slot of the ON/OFF cycle and the pilot tone is extracted at the output of the amplifier. If a pilot tone is not detected for a given time slot during the cycling operation then a corresponding stage has failed and a failure detect signal is output from the failure detect circuitry.

Referring to FIG. 7, a block schematic drawing of the failure detector and amplifier control circuit employed in the feed forward amplifier of FIG. 6A is illustrated. The failure detector and amplifier control circuit 62 includes an amplifier control circuit 68 which receives a clock signal as an input and generates control signals associated with specific time slots and provides them along lines 70-1 to 70-N to the switches described previously. The timing for the time slots may, for example, correspond to that described above in relation to FIG. 5. The control signal timing is also provided along line 74 to failure detect circuit 72 which employs the timing to detect amplifier stage failure. If amplifier stage failure is detected failure detect circuit 72 outputs a failure detect signal, as indicated which may light a warning light on a control panel and/or be used to modify control of the parameters of the feed forward amplifier. Amplifier control circuit 68 and failure detect circuit 72 may comprise separate circuits, as illustrated, or their function may be implemented in a microprocessor.

Similar modifications may be made in this embodiment as discussed above in relation to the first embodiment. Also, a number of additional modifications may be made in both embodiments as will be readily appreciated by those skilled in the art. Accordingly, the above described embodiments should not be viewed as limiting in any way and the proper scope of the invention is not limited to the particular embodiments disclosed.

What is claimed is:

1. An RF power amplifier, comprising:
   an amplifier input for receiving an RF signal to be amplified;
   an amplifier output for outputting an amplified RF signal;
   a multi-stage amplifier comprising a plurality of separate amplifier stages coupled between said amplifier input and amplifier output so as to cumulatively provide a desired amplifier gain to the input RF signal;
   a pilot tone generation circuit separately coupled to said multi-stage amplifier and injecting a pilot tone into said multi-stage amplifier;
   an amplifier control circuit coupled to said plurality of separate amplifier stages and duty cycling said amplifier stages ON and OFF; and
   a failure detection circuit coupled to detect the pilot tone output from said multi-stage amplifier and detecting individual amplifier stage failure based on said detected pilot tone.

2. An RF power amplifier as set out in claim 1, wherein the amplifier control circuit controls the ON/OFF operation of the amplifier stages such that each stage is ON during a unique time slot for each amplifier stage.

3. An RF power amplifier as set out in claim 2, wherein the failure detection circuit is coupled to the amplifier control circuit and receives the unique time slots therefrom and wherein the failure detection circuit detects individual amplifier stage failure by comparing the detected pilot tone to the individual time slots corresponding to each amplifier stage.

4. An RF power amplifier as set out in claim 3, wherein said amplifier control circuit is separately coupled to the amplifier stage power supply inputs via a plurality of switches.

5. An RF power amplifier as set out in claim 4, wherein said amplifier control circuit is coupled to said plurality of switches and controls the opening and closing of said plurality of switches based on a unique time slot for each amplifier stage.

6. An RF power amplifier, comprising:
   an amplifier input for receiving an RF signal to be amplified;
   an amplifier output for outputting an amplified RF signal;
   a plurality of separate amplifier stages coupled between said amplifier input and amplifier output so as to cumulatively provide a desired amplifier gain to the input RF signal; and
   means for detecting amplifier stage failure by providing a pilot tone to said amplifier stages, duty cycling the stages based on a separate timing for each stage, and detecting the pilot tone output from said stages based on said timing.

7. An RF power amplifier as set out in claim 6, wherein said means for detecting amplifier stage failure comprises amplifier control means for duty cycling said amplifier stages based on a separate timing for each stage and failure detect means for detecting the pilot tone output from said stages and detecting stage failure when a pilot tone is missing at a timing corresponding to a stage ON cycle.

8. An RF power amplifier as set out in claim 7, wherein said amplifier control means comprises a plurality of switches coupling the amplifier power generator supply to said amplifier stages, and an amplifier control circuit coupled to said switches and providing an ON/OFF control signal to said switches based on said timing.

9. An RF power amplifier as set out in claim 8, wherein said amplifier control circuit is separately coupled to each of said switches.

10. A feed forward amplifier, comprising:
    an RF input for receiving an RF signal;
    a main amplifier signal path coupled to the input and comprising:
      a main amplifier having a plurality of separate amplifier stages;
      a pilot tone generator generating a pilot tone coupled into the main amplifier input;
      a failure detection monitoring circuit coupled to the main amplifier output;
      an amplifier control circuit controlling the ON operation of the separate amplifier stages based on separate time slots; and
      a first delay circuit coupled to the output of the main amplifier; an error amplifier signal path coupled to the RF input and receiving a gain reduced output from the main amplifier, comprising:
        a second delay circuit coupled to the RF input,
        a combiner coupling the delay circuit output to the gain reduced output from the main amplifier so as to be out of phase therewith; and
        an error amplifier for amplifying the output of the combiner;
        a second combiner combining the output from the error amplifier and the first delay circuit so as to be out of phase therewith; and
        an output coupled to the second combiner and providing an amplified RF output.

11. A feed forward amplifier as set out in claim 10, wherein said amplifier control circuit comprises a plurality of switches coupled between the amplifier power supply and respective amplifier stages and a control circuit coupled to the switches and controlling the opening and closing of the switches.

12. A feed forward amplifier as set out in claim 11, wherein said control circuit provides a sequence of control signals in a time ordered sequence to said plurality of switches.

13. A feed forward amplifier as set out in claim 12, wherein said amplifier control circuit provides said time ordered sequence to said failure detection circuit.

14. A feed forward amplifier as set out in claim 10, wherein said failure detection circuit provides a failure detect signal when a pilot tone is missing in a time slot corresponding to an amplifier stage.

15. A feed forward amplifier as set out in claim 12, wherein said sequence of control signals are ON/OFF control signals.

16. A method for detecting amplifier stage failure in an RF amplifier having a main amplifier with a plurality of amplifier stages, comprising:

providing a pilot tone to said main amplifier;

duty cycling the amplifier stages with a unique time slot for each amplifier stage;

detecting the pilot tone output from the main amplifier; and providing an amplifier stage failure signal if a pilot tone is missing in a time slot corresponding to an amplifier stage.

17. A method for detecting amplifier stage failure in an RF amplifier as set out in claim 16, wherein duty cycling said amplifier stages comprises:

providing an ON/OFF control signal to a plurality of switches respectively connected to each amplifier stage; and opening and closing said switches with a timing such that each stage is ON in a unique time slot.

18. A method for detecting amplifier stage failure in an RF amplifier as set out in claim 16, wherein duty cycling said amplifier stages is performed periodically during amplifier operation.

19. A method for detecting amplifier stage failure in an RF amplifier as set out in claim 16, wherein duty cycling said amplifier stages is performed during amplifier start up.

20. A method for detecting amplifier stage failure in an RF amplifier as set out in claim 16, wherein duty cycling said amplifier stages is performed during an amplifier test.

* * * * *